United States Patent
Chen et al.

(10) Patent No.: US 9,674,991 B2
(45) Date of Patent: Jun. 6, 2017

(54) ELECTRONIC PACKAGED DEVICE

(71) Applicant: UNIVERSAL SCIENTIFIC INDUSTRIAL (SHANGHAI) CO., LTD., Shanghai (CN)

(72) Inventors: Jen-Chun Chen, Nantou County (TW); Pai-Sheng Shih, Nantou County (TW)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 14/954,206

(22) Filed: Nov. 30, 2015

(65) Prior Publication Data

US 2016/0081235 A1   Mar. 17, 2016

Related U.S. Application Data

(62) Division of application No. 14/286,965, filed on May 23, 2014, now Pat. No. 9,271,436.

(51) Int. Cl.
*H05K 9/00* (2006.01)
*H05K 13/04* (2006.01)
(Continued)

(52) U.S. Cl.
CPC ........... *H05K 9/0022* (2013.01); *H01L 24/19* (2013.01); *H01L 24/96* (2013.01); *H01L 24/97* (2013.01);
(Continued)

(58) Field of Classification Search
CPC ....................................................... H05K 9/00
(Continued)

(56) References Cited

U.S. PATENT DOCUMENTS

| 7,198,987 B1 | 4/2007 | Warren et al. |
| 2006/0067070 A1* | 3/2006 | Otsuki ................ H01L 23/5387 361/816 |

(Continued)

FOREIGN PATENT DOCUMENTS

| CN | 1926682 A | 3/2007 |
| CN | 102054821 A | 5/2011 |

(Continued)

OTHER PUBLICATIONS

China Patent Office, Office action issued on Feb. 27, 2017.
China Patent Office, Patent search report issued on Feb. 14, 2017.

*Primary Examiner* — Jerry Wu
(74) *Attorney, Agent, or Firm* — Li & Cai Intellectual Property (USA) Office

(57) ABSTRACT

A manufacturing method of electronic packaged device includes the following. A plurality of electronic components is disposed on a substrate carrier. An encapsulating member is disposed on the substrate carrier and covers the electronic components. The substrate carrier is separated from the encapsulating member. A plurality of first trenches is arranged on a first surface of the encapsulating member. Conductive material is disposed onto the first surface and into the first trenches to form a conductive layer. The conductive layer is patterned on the first surface to form a circuit layer. The circuit layer includes at least one grounding pad. A plurality of second trenches is arranged on a second surface of the encapsulating member. At least one shielding structure is formed in the first trenches and the second trenches. An electromagnetic shielding layer is connected to the grounding pad.

4 Claims, 7 Drawing Sheets

(51) Int. Cl.
  *H05K 1/18* (2006.01)
  *H01L 23/00* (2006.01)
  *H01L 21/56* (2006.01)

(52) U.S. Cl.
  CPC ........... *H05K 1/181* (2013.01); *H05K 9/0037* (2013.01); *H05K 9/0039* (2013.01); *H05K 9/0064* (2013.01); *H05K 13/046* (2013.01); *H01L 21/568* (2013.01); *H01L 2924/1815* (2013.01); *H01L 2924/3025* (2013.01); *H05K 2201/09036* (2013.01); *H05K 2201/10371* (2013.01); *Y10T 29/49155* (2015.01)

(58) Field of Classification Search
  USPC .................................................... 361/679.01
  See application file for complete search history.

(56) References Cited

U.S. PATENT DOCUMENTS

2006/0134982 A1* 6/2006 Zarganis ............ H01R 23/6873
  439/607.01
2013/0119523 A1 5/2013 Cheng et al.

FOREIGN PATENT DOCUMENTS

| CN | 102157392 A | 8/2011 |
|---|---|---|
| CN | 102364683 A | 2/2012 |

\* cited by examiner

ELECTRONIC PACKAGED DEVICE

CROSS REFERENCE TO RELATED APPLICATIONS

This application is a divisional application of Ser. No. 14/286,965 filed on May 23, 2014, and entitled "ELECTRONIC PACKAGED DEVICE AND MANUFACTURING METHOD THEREOF", now pending, the entire disclosures of which are incorporated herein by reference.

BACKGROUND OF THE INVENTION

1. Field of the Invention

The instant disclosure relates to an electronic packaged device.

2. Description of Related Art

Most electronic packaging devices use a variety of packaging materials to package electronic components. Since electronic products have more and more functions, thus the electronic components in the electronic packaging devices corresponding increases as well. Accordingly, electromagnetic interferences between different electronic components occur more often than ever.

Typically, in order to reduce various electromagnetic interference and radio frequency interferences generated by electronic components, an electromagnetic interference (EMI) layer is designed in the electronic packaging to isolate different electronic components. Alternatively, an external metal cover (Metal lid) is installed on the electronic packaging.

However, in the climate of miniaturization, the overall packaging density of electronic packaging dramatically increases. As a result, designing electromagnetic shielding layer in electronic packaging is becoming relatively more difficult. Alternatively, a metal cover installed on the electronic packaging increases the overall package volume.

To address the above issues, the inventor strives via associated experience and research to present the instant disclosure, which can effectively improve the limitation described above.

SUMMARY OF THE INVENTION

An embodiment of the instant disclosure provide an electronic packaging device which includes a shielding structure for prevent electromagnetic interferences between electronic components.

An embodiment of the instant disclosure provides an electronic packaged device including a circuit layer, a plurality of electronic components, an encapsulating member, a shielding structure, at least one grounding structure, and an electromagnetic shielding layer. The circuit layer includes at least one grounding pad. The electronic components and the circuit layer are electrically connected. The encapsulating member covers at least one electronic component. A trench is formed on the encapsulating member to partition into at least two encapsulating compartments. The shielding structure is interposed between different encapsulating compartments, and the shielding structure is electrically connected to the grounding pad. The electromagnetic shielding layer is formed on the external surface of the encapsulating member and electrically connected to the grounding pad.

In summary, the instant disclosure provides a manufacturing method of package device, in which electronic components are fixed onto a substrate carrier, and an encapsulating member is disposed on the surface of the substrate carrier to cover the electronic components. The substrate carrier is then separated from the encapsulating member. First trench is then formed on a first surface of the encapsulating member. Conductive material is disposed on the first surface of the encapsulating member and the outer surface of the first trench to form a conductive layer. The conductive layer is patterned to form a circuit layer, so that the circuit layer is formed directly on the encapsulating member instead of a circuit board to reduce the volume of the packaging. Successively, second trench is formed on the second surface of the encapsulating member. The second trench and the first trench are interconnected. A shielding structure is then formed in the first and the second trenches to reduce the electromagnetic and radio frequency interferences between encapsulating compartments. An electromagnetic shielding layer is then formed and is electrically connected to grounding pads.

The electronic packaged device of the instant disclosure includes an encapsulating member and a shielding structure. The shielding structure is interposed between different encapsulating compartments to reduce the electromagnetic and radio frequency interferences between encapsulating compartments. The shielding structure can transmit electromagnetic interfering signals to the surrounding via grounding pads, and enhance the effects of electromagnetic shielding for the electronic packaged device.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

Please refer to FIGS. 1A to 1K as schematic diagrams illustrating steps of an electronic packaged device manufacturing method in accordance with a first embodiment of the instant disclosure.

Figure 1A:
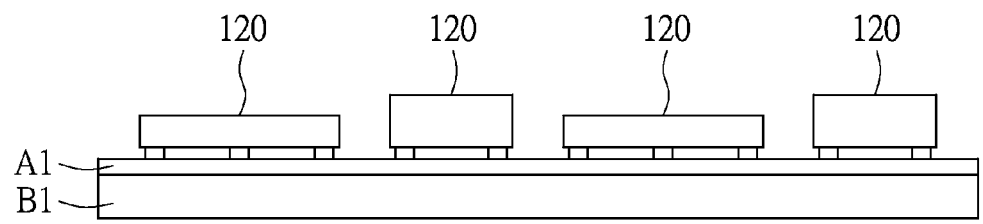
FIGS. 1A to 1K are cross-sectional views illustrating steps of an electronic packaged device manufacturing method in accordance with a first embodiment of the instant disclosure.

As shown in FIG. 1A, a plurality of electronic components 120 is configured on a surface of a substrate carrier B1. Adhesives A1 are applied onto the surface of the substrate carrier B1 to fix the electronic components 120 on the substrate carrier B1. Notably, the electronic components 120 can be chips, transistors, diodes, capacitors, inductors, or the like. The adhesives A1 may be glue, double sided tape, adhesive inks or the like. However, the coupling between the electronic components 120 and the substrate carrier B1 is not limited to the examples provided herein.

Figure 1B:
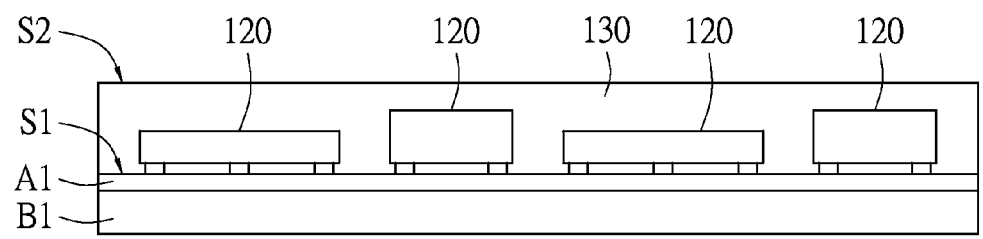

Please refer to FIG. 1B. An encapsulating member 130 is disposed on the surface of the substrate carrier to cover the electronic components 120. Typically, the encapsulating member 130 can be molding sealant or prepreg adhesives. The encapsulating member 130 is at least partially adhered to the substrate carrier's B1 surface and covers the electronic components 120. The encapsulating member 130 has a first surface S1 and a second surface S2 opposite the first surface S1. In the instant embodiment, the first surface S1 is the bottom surface of the encapsulating member 130 and the second surface S2 is the top surface of the encapsulating member 130. However, the first surface S1 can be the top surface of the encapsulating member 130 and the second surface S2 is the bottom surface of the encapsulating member 130 in another embodiment, and is not limited to the examples provided herein.

Figure 1C:
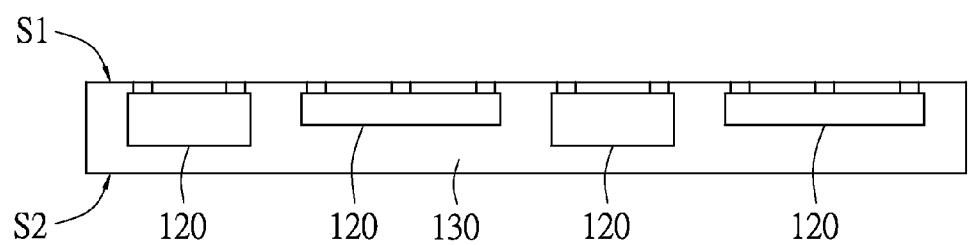

Please refer to FIG. 1C. The adhesives A1 are removed to separate the substrate carrier B1 from the encapsulating member 130. Typically, the adhesives can be mechanically removed by scraping or sanding as well as thermally treating the adhesives to remove the adhesiveness. Alternatively, solvents can be used to remove adhesives, but the removal of adhesives is not limited to the examples provided herein.

Figure 1D:
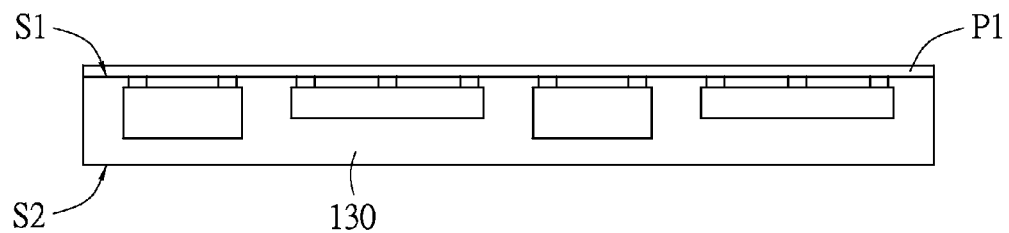

Please refer to FIG. 1D. The manufacturing method of the electronic packaged device can further include forming a protective layer P1 covering over the encapsulating member 130. Specifically, before forming trenches on the surface of the encapsulating member 130, the protective layer P1 is formed on the surface of the encapsulating member 130 covering thereof at desired positions where the trenches are to be formed, in which minimizes contamination to post-processing procedures or structures by particles or powder generated during the formation of the trenches. Typically, the protective layer P1 can be insulating ink coating or photoresist, but not limited to the examples provided herein. In the instant embodiment, the protective layer P1 is formed on the first surface S1.

Figure 1E:
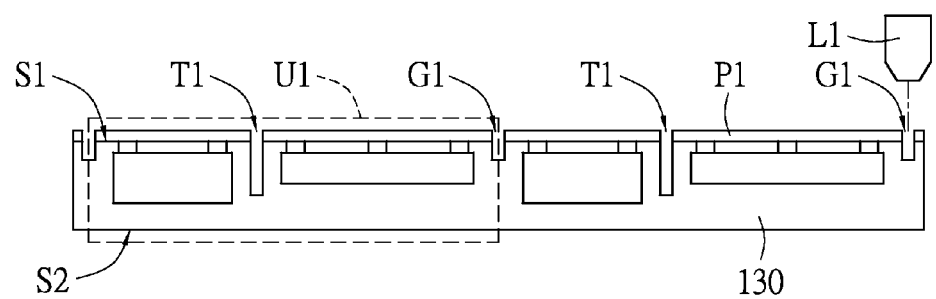

Please refer to FIG. 1E. A plurality of first trenches T1 and a plurality of first grounding trenches G1 are formed in the encapsulating member 130. Specifically, the first trenches T1 and first grounding trenches G1 are formed by laser L1 ablation through the surface of the protective layer P1 to portions of the encapsulating member 130. A packaged unit U1 is defined as a pre-determined region where a single packaged unit is obtained from the post process of singularization, and the single packaged unit is the electronic packaged device. Specifically, the first trenches T1 are arranged at the regions between electronic components 120, and the first grounding trenches G1 are arranged between the packaged units U1. Notably, the first trenches T1 and first grounding trenches G1 are not formed through the second surface S2 of the encapsulating member 130.

To accommodate the specifications of electromagnetic shielding and various configurations of the electronic components 120, the first trenches T1 can be of various shapes and bends to divide into three or more encapsulating compartments 130a in an embodiment but is not limited to the example provided herein.

After the first trenches T1 and first grounding trenches G1 are formed by laser L1 ablation, the protective layer P1 is removed. Notably, during the laser ablation process, powder or particles are generated when portions of the encapsulating member 130 are being removed to form the first trenches T1 and the first grounding trenches G1. Majority of those particles tends to stick onto the surface of the protective layer P1. As a result, solvent can be used to remove the protective layer P1 as well as the particles.

Figure 1F:
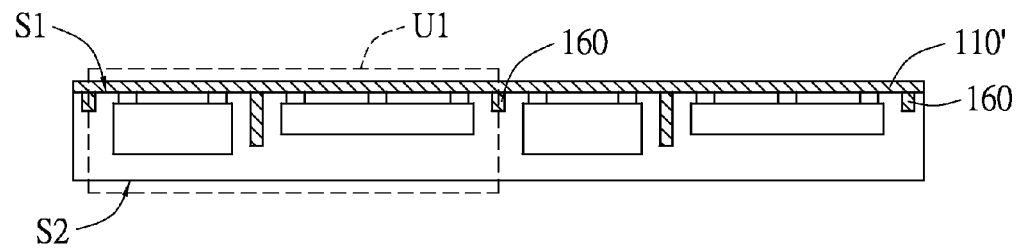

Please refer to FIG. 1F. Conductive material is disposed onto the first surface S1 of the encapsulating member 130 and filled into the first trenches T1 as well as the first grounding trenches G1. Specifically, the conductive material is disposed by spray coating, printing, electroplating or injection onto the first surface S1 of the encapsulating member 130, the first trenches T1, and the first grounding trenches G1 to at least cover the surface of the first trenches T1 and the first grounding trenches G1. In the instant embodiment, the conductive material covers the first surface S1 to form a conductive layer 110'. Moreover, the conductive material is also filled into the first trenches T1 and the first grounding trenches G1 to form a plurality of grounding structures 160. Successively, the conductive material is cured for solidification.

Figure 1G:
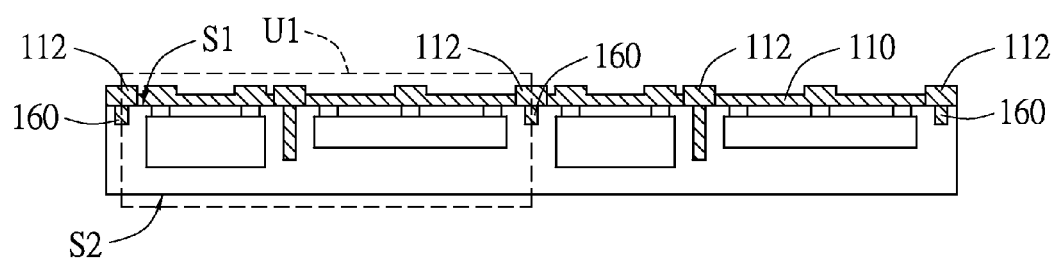

Please refer to FIG. 1G The conductive layer 110' on the first surface S1 is patterned to form a circuit layer 110. The circuit layer 110 includes at least one grounding pad 112 electrically connected to the grounding structure 160. The circuit layer 110 also includes the ground connections to active components and passive components. Notably, the circuit layer 110 is a re-distribution layer. In other words, the circuit layer 110 is arranged on the bottom surface of the packaged unit U1, whereas the grounding pad 112 is re-layout on the surrounding of the bottom surface of the packaged unit U1 in the instant embodiment. However, the grounding pad 112 can be arranged elsewhere due to various designs of the grounding circuits, and the arrangement of the grounding pad 112 is not limited to the examples provided herein.

Figure 1H:
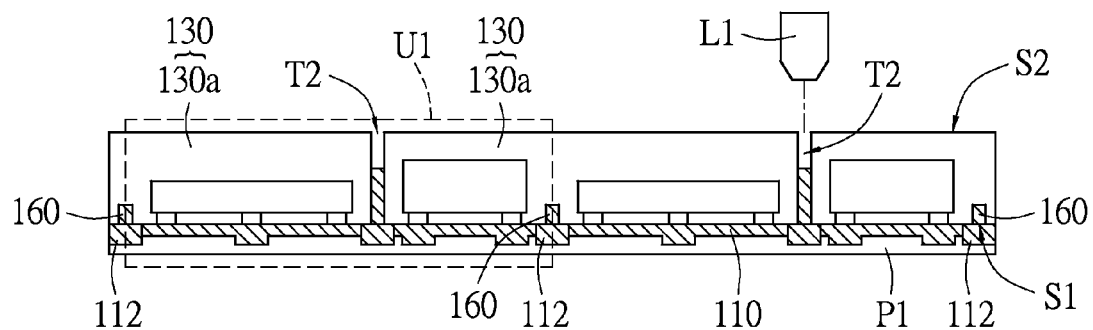

Please refer to FIG. 1H. A plurality of second trenches T2 corresponding to the first trenches T1 is formed on the second surface S2 of the encapsulating member 130. Before the plurality of second trenches T2 is formed on the second surface S2 of the encapsulating member 130, a protective layer P1 can be formed to cover the surface of the circuit layer 110. Notably, in the following process of electromagnetic shielding formation, the protective layer P1 can be first formed to cover the circuit layer 110 in order to prevent short circuiting due to contamination of the circuit layer 110. Successively, removing portions of the encapsulating member 130 via laser L1 ablation to form the second trenches T2. In the instant embodiment, the depths of the first trenches T1 and the second trenches T2 vary, where the depth of the first trenches T1 is about 70% of the depth of the encapsulating member 130. The first and the second trenches are interconnected to divide the encapsulating member 130 into at least two encapsulating compartments 130a.

Figure 1I:
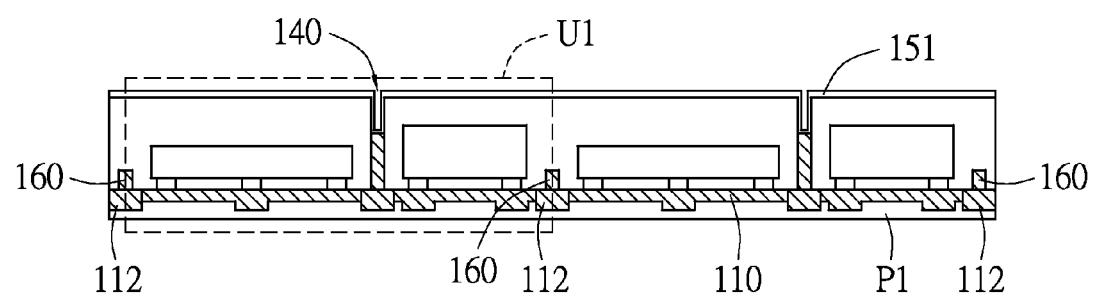

Please refer to FIG. 1I. Forming at least one shielding structure 140 in the first trenches T1 as well as the second trenches T2. In the instant embodiment, conductive material 151 is spray coated or sputtered onto the second surface S2 and onto outer surface of the second trenches T2. The conductive material on the surface of the second trench T2 and the conductive material in the first trench T1 are electrically connected to form the shielding structure 140. Notably, the shielding structure 140 and the grounding pas 113 can be electrically connected according to the various grounding circuit designs.

Figure 1J:
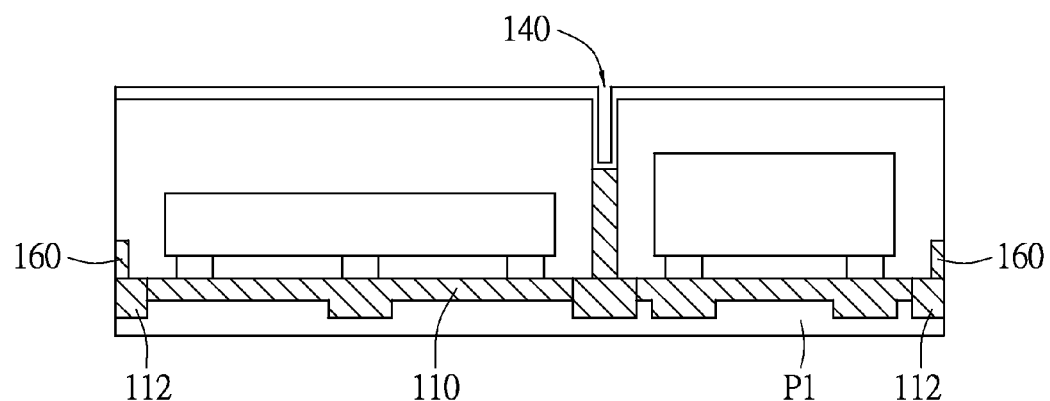

Please refer to FIG. 1J. The encapsulating member 130 is cut at the second surface S2 corresponding to the grounding structures 160 to divide into the plurality of packaged units U1.

Figure 1K:
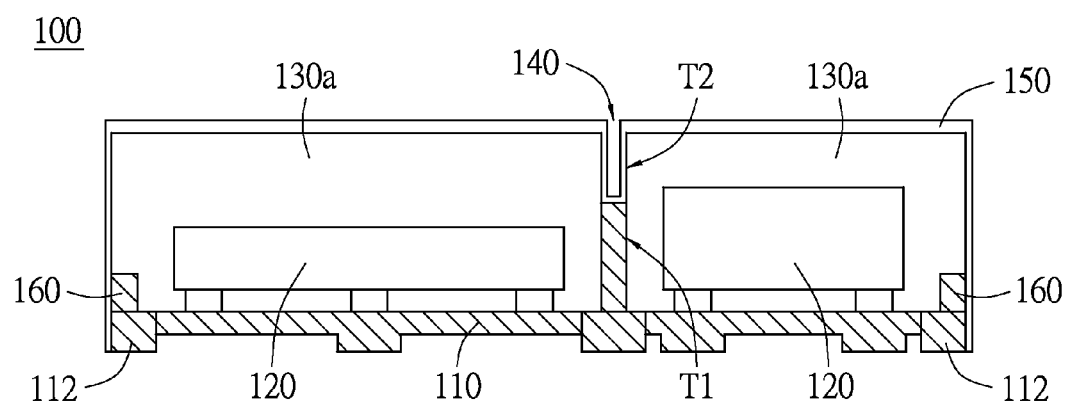

Please refer to FIG. 1K. The electromagnetic shielding layer 150 is formed to cover the encapsulating member 130.

Since the plurality of packaged units U1 are formed by cutting the encapsulating member 130 at the second surface S2 corresponding to the grounding structures 160, the grounding structures 160 are exposed at the sides of the packaged units U1. The exposed sides and top outer surfaces, also denoted as the external sides, of the packaged units U1 are spray coated or sputter with conductive material thereon to form a continuous layer of electromagnetic shielding layer 150 across the exposed sides and top outer surfaces, or the external sides, of the packaged units U1. However, the formation of the electromagnetic shielding layer 150 is not limited to example provided herein. Notably, the electromagnetic shielding layer 150, the grounding structure 160 and the grounding pads 112 are electrically connected. The protective layer P1 is then removed with solvents to simultaneously remove powder or particles on the protective layer P1. The electronic packaged device 100 is substantially provided.

Notably, the electronic packaged device manufacturing method can be applied to wafer level chip scale package (WLCSP) to package chips without the need of a substrate carrier or PCB, which improves upon the need to have electrically connection with the substrate carrier as in the conventional flip chip or wire bonding technology and also reduces the overall packaging volume. Moreover, the electromagnetic shielding layer 150 and the grounding pads 112 of the instant disclosure are electrically connected to reduce the effects of electromagnetic and radio frequency interferences.

Figure 2A:
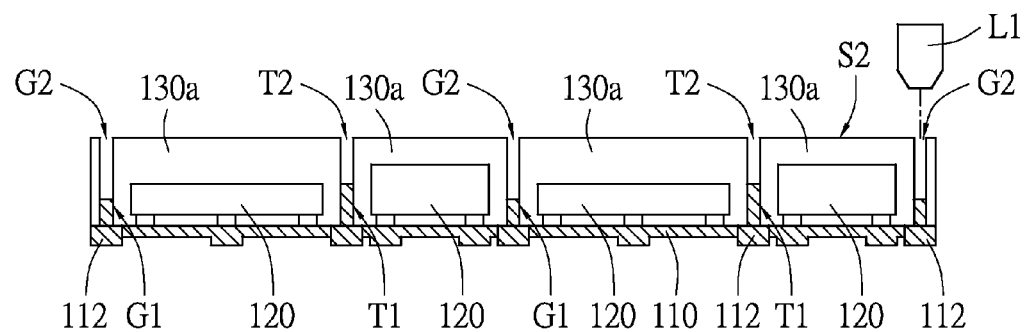
FIGS. 2A to 2C are cross-sectional views illustrating steps of the electronic packaged device manufacturing method in accordance with a second embodiment of the instant disclosure.
Figure 2B:
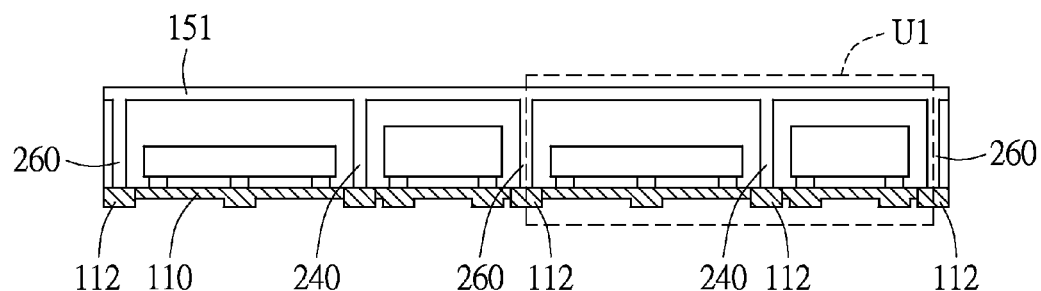
Figure 2C:
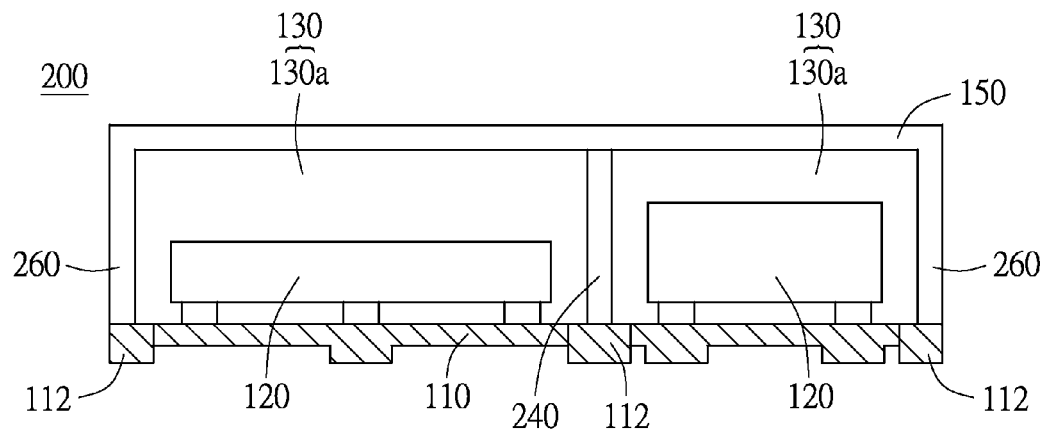

FIGS. 2A to 2C are schematic diagrams illustrating steps of the electronic packaged device manufacturing method in accordance with a second embodiment of the instant disclosure. The differences between the electronic packaged device method of the first and the second embodiments are further discloses as follows.

Please refer to FIG. 1G in conjunction with FIG. 2A as a continuation of the manufacturing method for the second embodiment. A plurality of second trenches T2 and a plurality of second grounding trenches G2 are formed on the second surface S2 of the encapsulating member 130. Specifically, laser L1 ablation is applied to remove portions of the encapsulating member 130 to form the second trenches T2 and second grounding trenches G2 in the second embodiment. Notably, the second trenches T2 correspond to and are interconnected to the first trenches T1, whereas the second grounding trenches G2 corresponding to the first grounding trenches G1 are electrically and physically connected to the first grounding trenches G1 to divide into at least two encapsulating compartments 130a.

Please refer to FIG. 2B. Conductive material 151 is formed on the second surface S2, and in the second trenches T2 as well as second grounding trenches G2 of the encapsulating member 130. Specifically, conductive material 151 is spray coated or sputter or injection or printing on the second surface S2, and in the second trenches T2 as well as second grounding trenches G2 of the encapsulating member 130. The conductive material 151 formed on the second surface S2 of the encapsulating member 130 is an electromagnetic shielding layer 150, whereas the conductive material 151 formed in the second trenches T2 and the conductive material 151 formed in the first trenches T1 are interconnected to form at least one shielding structure 240, meanwhile, the conductive material 151 formed in the second grounding trenches G2 and the conductive material 151 formed in the first grounding trenches G1 are electrically connected to form a plurality of grounding structures 260. Successively, the grounding structures 260 of the encapsulating member 130 are cut through from the second surface S2 to divide into a plurality of packaged units U1.

Please refer to FIG. 2C. The electromagnetic shielding layer 150 covering the second surface S2 are physically connected to the shielding structures 240 and the grounding structures 260 disposed on sides of the electronic packaged devices 200, whereas the electromagnetic shielding layer 150, the shielding structures 240, and the grounding structures 260 are electrically connected to each other. The electromagnetic shielding layer 150 on the surface of the packaged units U1 provides electromagnetic shielding via the grounding structures 260. The electromagnetic shielding layer 150 covers the encapsulating member 130 and is electrically connected to the grounding pads 112.

Notably in the second embodiment, the shielding structure 240 and the grounding structure 260 are first formed on the sides of the uncut electronic packaged device 200 and then are cut to form the plurality of electronic packaged devices 200, the protective layer P1 is not necessary formed on outer surface of the circuit layer 110 when the second trenches T2 are being formed. FIGS. 3A to 3D are schematic diagrams illustrating steps of the electronic packaged device manufacturing method in accordance with a third embodiment of the instant disclosure. The differences between the electronic packaged device method of the third and the second embodiments are further discloses as follows. Please refer to FIGS. 3A to 3D.

Figure 3A:
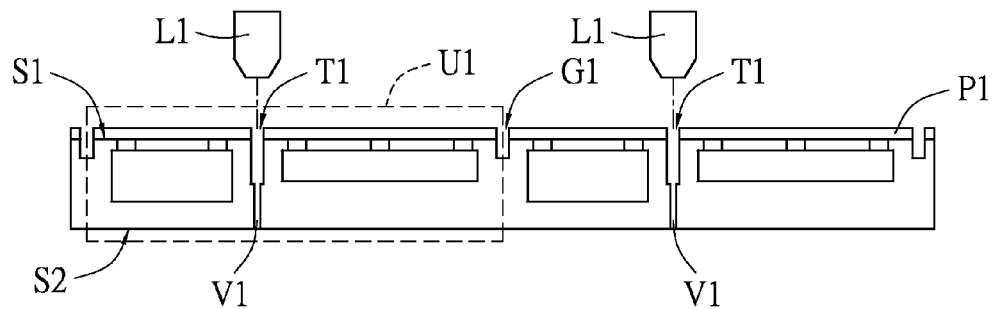
FIGS. 3A to 3D are cross-sectional views illustrating steps of the electronic packaged device manufacturing method in accordance with a third embodiment of the instant disclosure.

Please refer to FIG. 1E in conjunction with FIG. 3A as a continuation of the manufacturing method for the instant embodiment. A plurality of through holes V1 is formed on the first trenches T1 via laser L1 ablation. The through holes V1 have small diameters and formed from the first trenches T1 through the encapsulating member 130 and to the second surface S2. Notably, the diameters of the through holes V1 range from about 20 to 40 microns (μm).

Figure 3B:
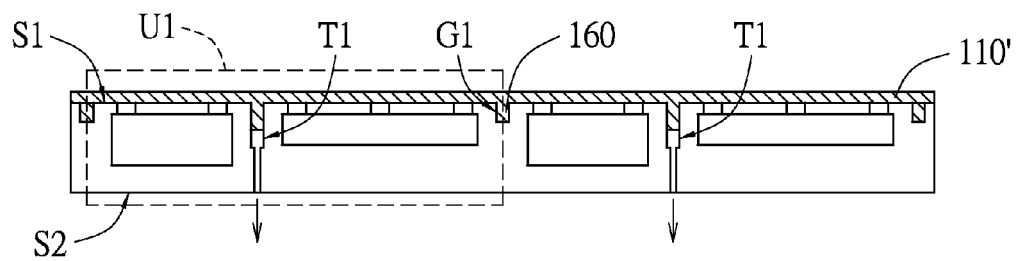

Please refer to FIG. 3B. Conductive material is disposed on the first surface S1 and into the first trenches T1 as well as in to the first grounding trenches G1. Specifically, conductive materials are spray coated, printed, sputter, or injected on the first surface S1 of the encapsulating member 130 as well as filling in the first trenches T1 and the first grounding trenches G1 to form the conductive layer 110'. Suction is then provided from the second surface S2 of the encapsulating member 130 via the through holes V1, such that the conductive material can smoothly flow into the first trenches T1. In the instant embodiment, the conductive material covers the first trenches T1, the surface of the first grounding trenches G1, as well as filling in the first trenches T1 and the first grounding trenches G1 to form the plurality of grounding structures 160. Successively, the conductive material is cured for solidification.

Figure 3C:
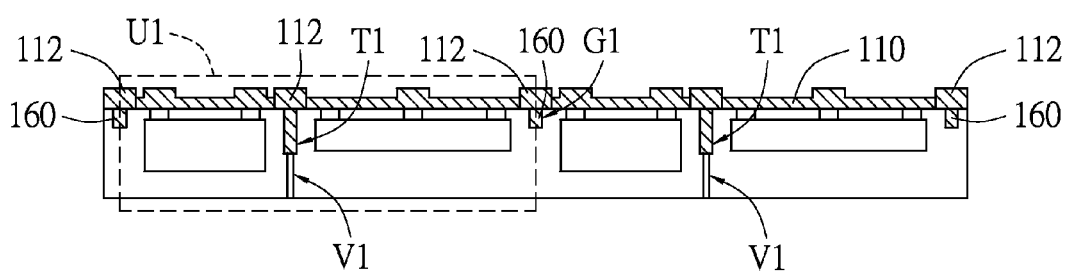

Please refer to FIG. 3C. The conductive layer 110' of the first surface S1 of the encapsulating member 130 is patterned to form a circuit layer 110. The circuit layer 110 includes at least one grounding pad 112 electrically connected to the grounding structure 160. Notably, the circuit layer 110 is a re-distribution layer in the instant embodiment.

Figure 3D:
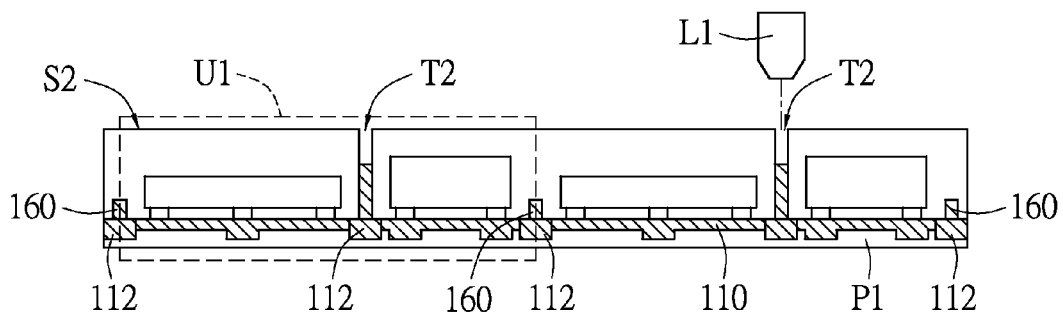

Please refer to FIG. 3D. Second trenches T2 are formed on the second surface S2 of the encapsulating member 130. The second trenches T2 are formed by removing portions of the encapsulating member 130 from the position proximate to the through holes V1. The second trenches T2 and the first trenches T1 are electrically connected. In the instant embodiment, the width of the first and the second trenches T1, T2 are identical. However, the width of the first and second trenches T1, T2 can be different and are not limited to the examples provides herein.

Please refer to FIGS. 1I to 1K as a continuation of the manufacturing method in FIG. 3D for the instant embodiment.

Figure 4:
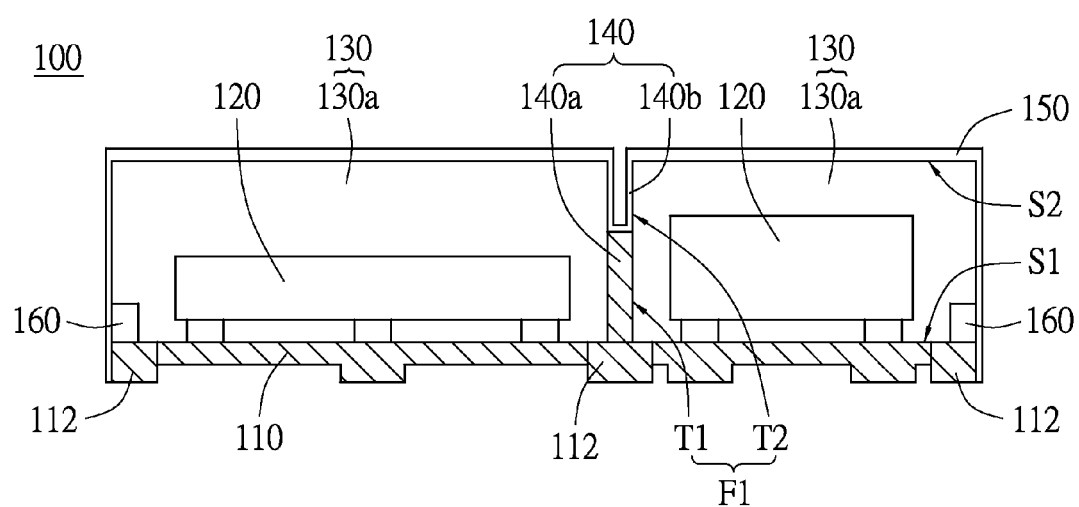
FIG. 4 is a schematic diagram of an electronic packaged device in accordance with the first embodiment of the instant disclosure

Please refer to FIG. 4 as a schematic diagram of an electronic packaged device in accordance with the first embodiment of the instant disclosure. The electronic packaged device 100 includes a circuit layer 110, a plurality of electronic components 120, an encapsulating member 130, a shielding structure 140, at least one grounding structure 160, and an electromagnetic shielding layer 150. The electronic components 120 and the circuit layer 110 are electrically connected. The encapsulating member 130 covers at least one electronic component 120 and includes at least two encapsulating compartments 130a. The shielding structure 140 is interposed between different encapsulating compartments 130a, and the electromagnetic shielding layer 150 is formed on the encapsulating member 130.

The circuit layer 110 includes grounding pads 112 and electric circuits. In the instant embodiment, the circuit layer 110 is a redistribution layer so the grounding pads 112 are re-layout proximate to the surrounding of the bottom surface of the packaged units U1. The grounding pads 112 and the electric circuits can be configured according to the arrangement of the electronic components.

Electronic components 120 can be of various kinds and are not necessarily identical. Examples of electronic components 120 can be chips, transistors, diodes, capacitors, inductors or the like. As shown in FIG. 4, the electronic components 120 can be various sizes and shapes or types, and are not limited to the examples provides herein.

The encapsulating member 130 includes a first surface S1 and an oppositely arranged second surface S2. In the instant embodiment, the first surface S1 is the bottom surface of the encapsulating member 130 and is in contact with the circuit layer 110, whereas the second surface S2 is the top surface of the encapsulating member 130. Notably, the first trenches T1 and the second trenches T2 are respectively formed on the first surface S1 and the second surface S2 of the encapsulating member 130. The first trenches T1 and the second trenches T2 inwardly extend in the encapsulating member 130, such that the first and the second trenches T1, T2 are interconnected. The first and the second trenches T1, T2 cooperatively defines a region therebetween as a trench F1. In other words, the trench F1 extend through the top surface (second surface S2) of the encapsulating member 130 to the bottom surface (first surface S1) of the encapsulating member 130 to divide into at least two encapsulating compartments 130a.

In the instant embodiment, the encapsulating member 130 includes two encapsulating compartments 130a each covering at least one electronic component 120. However, the encapsulating member 130 can include three or more encapsulating compartments 130a that can cover the electronic components 120, but the number of components is not limited to the examples provided herein.

Notably, the encapsulating member 130 can be molding sealant to prevent unnecessary electrical connectivity, short circuiting, or the like. The encapsulating member 130 can be pre-impregnated material (prepreg) such as glass fiber prepreg, carbon fiber prepreg, epoxy resin, or the like.

The shielding structure 140 is disposed in the trench F1 between the encapsulating compartments 130a. Specifically, the shielding structure 140 is disposed in the encapsulating member 130 and extends from the top surface to the bottom surface of the encapsulating member 130, such that various encapsulating compartments 130a can be divided. In the instant embodiment, the shielding structure 140 includes a first portion 140a and a second portion 140b. Conductive material 151 is spray coated, printed, sputter, or injected into the first trench T1 to form the first portion 140a, whereas conductive material 151 is spray coated or sputter on the outer surface of the second trench T2 to form the second portion 104b. Notably, the conductive material on the outer surface of the second trench T2 is electrically connected to the conductive material in the first trench T1 In other words, the first portion 140a and the second portion 140b are electrically connected to form the shielding structure 140.

Notably, the shielding structure 140 reduces electromagnetic and radio frequency interferences between the encapsulating compartments 130a. The shielding structure 140 provides further electromagnetic shielding of the electronic packaged device by transmitting electromagnetic interferences to the ground via the grounding pads 112, and further enhances the effects of electromagnetic shielding between electronic components 120 covered in the encapsulating compartments 130a.

Notably, the shielding structure 140 is made of metal such as copper, aluminum, silver, nickel or the like. However, the shielding structure 140 can also be conductive polymers such as polyaniline (PAn), polypyrrole (PYy), polythiophene (PTh) or the like, and is not limited to the examples provided herein.

The electromagnetic shielding layer 150 is formed on the second surface S2 and the exposed sides of the encapsulating member 130. The electromagnetic shielding layer 150 is electrically connected to the second portion 140b of the shielding structure 140. Specifically, the electromagnetic shielding layer 150 reduces surrounding electromagnetic interferences from the electronic components 120. In the instant embodiment, the grounding structure 160 is exposed at the cut sides of the encapsulating member 130 and is electrically connected to the grounding pads 112. The electromagnetic shielding layer 150 covers the top outer surface and exposed sides (the top outer surface and the exposed sides are denoted as the external sides) of the encapsulating member 130. In another embodiment, the electromagnetic shielding layer 150 covers exposed sides of the grounding pads 112 and electrically connected to the grounding structure 160 and the grounding pads 112, such that the electromagnetic shielding layer 150 can transmit electromagnetic interfering signals to the grounding pads 112 of the circuit layer 110, and enhance electromagnetic shielding effects for the electronic packaged device. However, the electromagnetic shielding layer 150 can also cover only the top surface and the exposed sides of the encapsulating member 30 while not extended to the grounding pads 112. As a result, the electromagnetic shielding layer 150 can transmit electromagnetic interfering signals to the ground via the grounding structure 160.

The structure of the electronic packaged device in accordance with the instant disclosure can be applied to wafer level chip scale package (WLCSP) to package chips without the need of a substrate carrier or PCB, which improves upon the need to have electrically connection with the substrate carrier as in the conventional flip chip or wire bonding technology and also reduces the overall packaging volume. Moreover, the electromagnetic shielding layer 150 and the grounding pads 112 of the instant disclosure are electrically connected to reduce the effects of electromagnetic and radio frequency interferences.

Please refer to FIG. 2C as schematic diagrams illustrating the structure of the electronic packaged device in accordance with the second embodiment of the instant disclosure. The electronic packaged device 200 and the electronic packaged device 100 are similar, so the differences will be disclosed as follow.

In the instant embodiment, the shielding structure 240 is formed by spray coating, sputtering, printing, injection or the like to fill the trench F1 with conductive material. The shielding structure 240 extends from the first surface S1 (bottom surface) to the second surface S2 (top surface) of the encapsulating member 130 and is electrically connected to the electromagnetic shielding layer 150.

Moreover, the electromagnetic shielding layer 150 covers the second surface S2 of the encapsulating member 130 to electrically connect to the shielding structure 240, and the electromagnetic shielding layer 150 is physically and electrically connected to the grounding structure 260 at the sides of the electronic packaged device 200. The sides of the electronic packaged device 200 are electromagnetic shielded by the grounding structure 260. The electromagnetic shielding layer 150 covers the encapsulating member 130 and is electrically connected to the grounding pads 112.

In summary, the instant disclosure provides a package device manufacturing method. Electronic components are fixed onto a substrate carrier by adhesives, and an encapsulating member is disposed on the surface of the substrate carrier to cover the electronic components. The substrate carrier is then separated from the encapsulating member. First trench is then formed on a first surface of the encapsulating member. Conductive material is disposed on the first surface and the outer surface of the first trench to form a conductive layer. The conductive layer is patterned to form a circuit layer, so that the circuit layer is formed directly on the encapsulating member instead of a circuit board to reduce the volume of the packaging. Successively, second trench is formed on the second surface of the encapsulating member. The second trench and the first trench are interconnected. A shielding structure is then formed in the first and the second trenches to reduce the electromagnetic and radio frequency interferences between encapsulating compartments. An electromagnetic shielding layer is then formed and is electrically connected to grounding pads.

The electronic packaged device of the instant disclosure includes an encapsulating member and a shielding structure. The shielding structure is interposed between different encapsulating compartments to reduce the electromagnetic and radio frequency interferences between encapsulating compartments. The shielding structure can transmit electromagnetic interfering signals to the surrounding via grounding pads, and enhance electromagnetic shielding for the electronic packaged device.

The figures and descriptions supra set forth illustrated the preferred embodiments of the instant disclosure; however, the characteristics of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. An electronic packaged device, comprising: a circuit layer including at least two grounding pads; a plurality of electronic components electrically connected to the circuit layer; an encapsulating member covering at least one electronic component, the encapsulating member having portions defining a trench to separate the encapsulating member into at least two encapsulating compartments; at least one grounding structure electrically connected to the at least two grounding pads; a shielding structure arranged between the encapsulating compartments; and an electromagnetic shielding layer disposed on the external surfaces of the encapsulating member and electrically connected to the at least two grounding pads; wherein the trench is defined as a first trench and a second trench, the shielding structure includes a first portion and a second portion, the first portion is defined as conductive material filled in the first trench, and the second portion is defined as conductive material covering outer surface of the second trench, the first portion is electrically connected to the second portion, and the second portion is electrically connected to the electromagnetic shielding layer.

2. The electronic packaged device as recited in claim 1, wherein the first trench is formed on a bottom surface of the encapsulating member, the second trench is formed on a top surface of the encapsulating member, and the first trench and the second trench inwardly extend into the encapsulating member.

3. The electronic packaged device as recited in claim 1, wherein the shielding structure is defined as conductive material filled in the trench, and the shielding structure is electrically connected to the electromagnetic shielding layer.

4. The electronic packaged device as recited in claim 1, wherein at least one encapsulating compartment accommodates at least one electronic component.

* * * * *